(12) United States Patent
Perry et al.

(10) Patent No.: US 8,191,020 B1
(45) Date of Patent: May 29, 2012

(54) GRAPHICAL USER AID FOR TECHNOLOGY MIGRATION AND ASSOCIATED METHODS

(75) Inventors: Steven Perry, Bucks (GB); Jinyong Yuan, Cupertino, CA (US); Shih Yueh Lin, Palo Alto, CA (US); John R. Chase, San Jose, CA (US)

(73) Assignee: Altera Corporation, San Jose, CA (US)

( * ) Notice: Subject to any disclaimer, the term of this patent is extended or adjusted under 35 U.S.C. 154(b) by 282 days.

(21) Appl. No.: 12/612,479

(22) Filed: Nov. 4, 2009

Related U.S. Application Data

(62) Division of application No. 11/181,110, filed on Jul. 13, 2005, now Pat. No. 7,631,284.

(51) Int. Cl.
*G06F 17/50* (2006.01)

(52) U.S. Cl. ......... 716/104; 716/116; 716/117; 716/139

(58) Field of Classification Search .......... 716/100–107, 716/116–117, 139
See application file for complete search history.

(56) References Cited

U.S. PATENT DOCUMENTS

| | | |
|---|---|---|
| 6,223,326 B1 | 4/2001 | Fields et al. |
| 6,334,207 B1 | 12/2001 | Joly et al. |
| 6,631,508 B1 | 10/2003 | Williams |
| 7,058,921 B1 * | 6/2006 | Hwang et al. ................. 716/116 |
| 7,131,098 B2 | 10/2006 | Darringer et al. |
| 7,275,232 B2 | 9/2007 | Schleicher, II et al. |
| 7,340,693 B2 | 3/2008 | Martin et al. |

* cited by examiner

*Primary Examiner* — Paul Dinh
(74) *Attorney, Agent, or Firm* — Ropes & Gray LLP

(57) ABSTRACT

A graphical user aid that may be used for migrating source devices, such as programmable logic designs (PLDs or FPGAs) into target devices, such as equivalent or substitute application-specific integrated circuits ("ASICs") is provided. A device selector guide is provided for evaluating migration prospects from the source device to the target device before completing the migration.

20 Claims, 5 Drawing Sheets

10

| Resource | FPGA | ASIC1 | ASIC2 | ASIC3 | ASIC4 | ASIC5 | ASIC6 |
|---|---|---|---|---|---|---|---|
| Package | FBGA - 1020 | FBGA - 484 | FBGA - 672 | FBGA - 672 | FBGA - 1020 | FBGA - 1020 | FBGA - 1508 |
| Logic | | 19% | 10% | 10% | 7% | 5% | 5% |
| -- Lcells | 17773 ALUTs | -- | -- | -- | -- | -- | -- |
| -- DSP | 16 Blocks | -- | -- | -- | -- | -- | -- |
| Pins | | | | | | | |
| -- Total | 480 | 480 / 341 | 480 / 499 | 480 / 501 | 480 / 701 | 480 / 741 | 480 / 950 |
| -- LVDS | 118 | 118 / 84 | 118 / 124 | 118 / 124 | 118 / 192 | 118 / 480 | 118 / 480 |
| -- PCI/PCI-X | 28 | 28 / 246 | 28 / 366 | 28 / 366 | 28 / 502 | 28 / 703 | 28 / 703 |
| -- DDR | 0 | 0 / 87 | 0 / 1 | 0 / 126 | 0 / 358 | 0 / 471 | 0 / 471 |
| Memory | | | | | | | |
| -- M-RAM | 1 | 1 / 0 | 1 / 2 | 1 / 2 | 1 / 6 | 1 / 9 | 1 / 9 |
| -- M4K/M512 | 512 | 512 / 190 | 512 / 408 | 512 / 408 | 512 / 609 | 512 / 768 | 512 / 768 |
| PLLs | | | | | | | |
| -- Enhanced | 2 | 2 / 2 | 2 / 4 | 2 / 4 | 2 / 4 | 2 / 4 | 2 / 4 |
| -- Fast * | 5 | 5 / 2 | 5 / 4 | 5 / 4 | 5 / 6 | 5 / 8 | 5 / 8 |
| DLLs | 0 | 0 / 1 | 0 / 1 | 0 / 1 | 0 / 2 | 0 / 2 | 0 / 2 |
| SERDES | | | | | | | |
| -- RX | 29 | 29 / 21 | 29 / 31 | 29 / 31 | 29 / 46 | 29 / 116 | 29 / 116 |
| -- TX | 6 | 6 / 19 | 6 / 29 | 6 / 29 | 6 / 46 | 6 / 116 | 6 / 116 |

* Although this PLL resource may be exceeded for a target device, other PLL resources could possibly be used to acheive a successful fit.

FIG. 1

GRAPHICAL USER AID FOR TECHNOLOGY MIGRATION AND ASSOCIATED METHODS

CROSS-REFERENCE TO RELATED APPLICATION

This application is a divisional of U.S. patent application Ser. No. 11/181,110, filed Jul. 13, 2005 which is hereby incorporated by reference herein in its entirety.

BACKGROUND

This invention relates to a graphical user aid that may be used for migrating a circuit design from a source device into a target device. For example, programmable logic designs (PLDs or FPGAs) may be migrated into equivalent or substitute application-specific integrated circuits ("ASICs"). The invention also relates to a device selector guide for evaluating migration prospects before completing the migration.

A typical programmable logic device ("PLD") or field-programmable gate array ("FPGA") includes many logic elements ("LEs") of a fixed size. (For convenience herein, the term FPGA is used as a generic term for PLDs and FPGAs.) For example, an FPGA LE may include a four-input look-up table ("LUT"), a register, and some routing circuitry that allows the register to be either used (e.g., to register the output of the LUT) if sequential logic or operation is desired, or to be bypassed by the LUT output if only combinational or combinatorial logic or operation is desired. An FPGA LE may also have other features or capabilities, but the foregoing example will be sufficiently illustrative. In addition to many LEs, an FPGA also typically has programmable routing circuitry for conveying signals to, from, and/or between the LEs in any of many different ways so that very complex and/or extensive logic or logic-type operations can be performed by combining or otherwise using multiple LEs. Also in addition to LEs, an FPGA may have other types of circuitry, such as input/output ("I/O") circuitry, blocks of memory, microprocessors, special-purpose circuitry such as digital signal processing ("DSP") blocks, delay locked loops ("DLL"), phase locked loops ("PLL"), high-speed serial interface ("HSSI") blocks, etc. These other types of circuitry may also be interconnectable to one another (and to the LEs) via the above-mentioned programmable routing circuitry.

FPGAs have many advantages that are well known to those skilled in the art. In some instances, however, it may be desirable to replace the FPGA with an ASIC equivalent device so that cost can be reduced in a high-volume application. For example, a design may start out in an FPGA. But after that design has been sufficiently proven and has reached sufficiently high volume, substituting an ASIC equivalent can be very cost-effective.

One approach to providing ASIC equivalents to FPGAs employs an ASIC architecture having the same basic organization of circuit resources as the starting FPGA. For example, if the FPGA includes an array of LEs, each of which has a four-input LUT ("4-LUT") and a register, then the ASIC has a similar array of LEs including 4-LUTs and registers. Certain layers in the ASIC are then customized to a particular user's design to effectively "program" the LEs and to provide the required interconnection routing among the LEs.

A second approach to providing ASIC equivalents of FPGAs includes circuit resources in the ASIC equivalent that are not the same as the circuit resources used in the FPGA. For example, the ASIC equivalent device may have logic elements referred to herein as hybrid logic elements ("HLEs"). Each HLE may include a relatively small, general-purpose, combinatorial logic component (e.g., a one-input LUT or "2-LUT"), a relatively small array of logic gates (e.g., two two-input NAND gates), and some associated interconnection or routing resources. The amount of operational circuitry in an HLE (e.g., the 2-LUT and the NAND gates) is much less than the amount of operational circuitry in a related FPGA LE. At least some aspects of the routing resources in an HLE are programmable (e.g., mask programmable using vias) for such purposes as making input connections to the HLE, output connections from the HLE, and internal connections within the HLE. For some relatively under-utilized FPGA LEs, one ASIC HLE can perform the functions of the LE. If an LE has greater utilization, then several adjacent (or at least nearby) HLEs may be needed to equivalently perform the LE's functions. The routing resources of HLEs facilitate interconnecting adjacent (or nearby) HLEs that need to be put together to perform any LE's functions. In any case, only as many HLEs as are necessary to perform an LE's functions are used to provide an equivalent of that LE. Because many LEs in most designs are not fully utilized, the number of HLEs provided on an ASIC for use as equivalent to an FPGA can be significantly less than the number of HLEs that would be required if all LEs were fully utilized. This is a significant ASIC size reduction as compared to an ASIC that uses a fully featured LE for each FPGA LE. Furthermore, by using HLEs or other logic elements that are not the same as the LEs in the equivalent FPGA, multiple equivalent ASIC sizes and technology families may be used as equivalents to one FPGA. Similarly, it may also be advantageous to replace or substitute other circuit resources of the FPGA with different numbers or types of circuit resources in the ASIC equivalent device.

This second approach to providing ASIC equivalents of FPGAs may result in advantages, such as, ASIC size reduction. However, like any migration of a chip design from one technology family to another, there are uncertainties as to how well the resources in the source technology will map to the resources of the destination technology. Typically, in order to resolve these uncertainties the potentially long and costly migration must actually be performed.

SUMMARY

In view of the foregoing, a graphical user aid for migrating a circuit design from a source device, such as, a programmable logic circuit into a target device, such as a substitute ASIC is provided. The graphical user aid includes a device selector guide that may be displayed to a user after the compilation of a circuit design in a source technology or device.

According to a preferred embodiment, the device selector guide may be displayed as a color-coded table. The table's rows may be categorized and subcategorized based on circuit resources, such as, pins, logic, memory, package, etc. One column may show the circuit resource usage of the circuit design in the source device and the remaining columns may show the estimated circuit resource usage of the circuit design migrated into each of the target devices. The circuit resource usage may be shown, for example, using numerical information, graphical information (e.g., a color coding scheme), or any suitable display technique.

The device selector guide may allow a user to evaluate the prospects for a device migration without having to actually perform the migration, which can be costly, or even impossible at early stages of product development. Also, the device selector guide may serve as a marketing tool to generate interest in a technology migration path.

Further features of the invention, its nature and various advantages, will be more apparent from the accompanying drawings and the following detailed description.

BRIEF DESCRIPTION OF THE DRAWINGS

FIG. 1 illustrates a simplified device selector guide in accordance with this invention.

DETAILED DESCRIPTION

Figure 2:
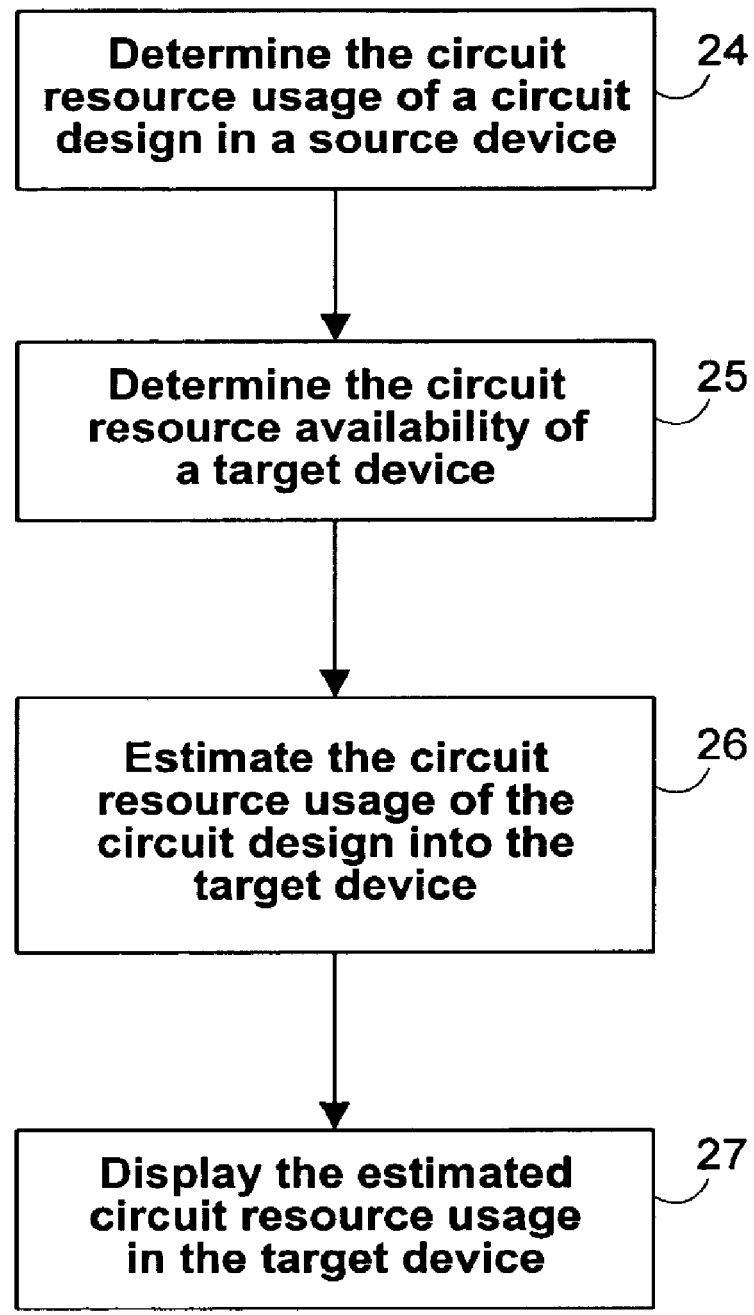
FIG. 2 is a flow chart for an illustrative method in accordance with the invention.

A simplified device selector guide 10 in accordance with the invention is illustrated in FIG. 1. Device selector guide 10 provides a rough overview of how the circuit resource usage from a circuit design in an FPGA source device may translate into the circuit resource usage in a ASIC equivalent target device. Further, device selector guide 10 may provide this overview of the circuit resource usage in multiple ASIC equivalent target devices to allow a user to compare the multiple ASIC equivalent target devices and to help determine which of the ASIC equivalent target devices to choose. While the present embodiment relates to the migration from an FPGA source device to an ASIC equivalent target device, it should be understood that device selector guide 10 may be used for any suitable migration, including for example, migrating from one type of programmable logic device to another type of programmable logic device and migrating from one type of ASIC device to another type of ASIC device.

In the embodiment illustrated in FIG. 1 device selector guide 10 is displayed as a table. However, it should be understood that the information presented within device selector guide 10 may also be displayed with other suitable types of tables, graphs, charts, or information displays. The user may be able to select a preferred display type or even customize the display based on the user's preferences.

The rows of device selector guide 10 may correspond to different categories of circuit resources. For example, device selector guide 10 may contains rows for basic circuit resource categories, such as, package 11, logic 12, pins 13, memory 14, PLLs 15, DLLs 16, and SERDES 17. Device selector guide 10 may also contain rows containing subcategories of circuit resources. For example, under the row for logic 12 there are subcategories for LCells 12A and DSP 12B. The circuit resource categories shown in device selector guide 10 will be described in more detail below.

The categories and subcategories of basic circuit resources shown in device selector guide 10 are merely illustrative of some of the circuit resources whose usage may be monitored when attempting to migrate from an FPGA device into one or more equivalent ASIC devices. It should be understood that the number and type of hardware resources displayed in device selector guide 10 may be user-customizable and may vary based on the circuit design, and the source and target devices. The circuit resource subcategories may be similarly varied or hidden.

The columns in device selector guide 10 may correspond to the source and target devices. For example, in device selector guide 10, the first column corresponds to the FPGA device and the remaining columns correspond to multiple ASIC equivalent devices. The columns present the amount of circuit resources used in the FPGA device as well as an estimate of the amount of circuit resources that would be required and that are available in each of the ASIC equivalent devices.

The cells of device selector guide 10 may be color-coded, shaded, or similarly visually distinguished as a visual aid to indicate the relative resource usage of a hardware resource in a target ASIC equivalent device. Because of limitations on what is permitted in patent drawings, color has not been actually used in FIG. 1. Instead, features like cell outline shape and weight, text weight, and the like have been used in FIG. 1 to distinguish cells containing information falling into categories of possibly different significance. For example, cells like cell 18 may have a green color coding or other visually distinguishing characteristic to indicate low estimated circuit resource usage in the target device (e.g., less than 80% usage), cells like cell 19 may have a yellow color coding or other visually distinguishing characteristic to indicate moderate or high estimated circuit resource usage in the target device (e.g., greater than 80% usage, but less than 100% usage), and cells like cell 20 may have a red color coding or other visually distinguishing characteristic to indicate that the estimated circuit resource usage in the target device exceeds the circuit resources available in the device (e.g., greater that 100% usage). More generally, one type of cell (e.g., a green color coded cell) may indicate a high probability of a successful migration, another type of cell (e.g., a yellow color coded cell) may indicate a moderate probability of successful migration, and a third type of cell (e.g., a red color coded cell) may indicate a low or no probability of successful migration.

By visually distinguishing the cells of device selector guide 10 in this manner, a user may easily see if a potential target ASIC equivalent device has enough resources available to be migratable from the source FPGA device. Device selector guide 10 may also contain a legend to show all of the different visually distinguishing characteristic used and to explain their meaning.

In addition to visually distinguishing individual cells, an entire column or a column heading may be visually distinguished to indicate the combined resource availability of each ASIC equivalent design (not shown).

Some of the benefits of device selector guide 10 may be illustrated by looking at the exemplary data shown in device selector guide 10. The data shown in device selector guide 10 may further serve to illustrate how device selector guide 10 may be used to assist in the migration of an FPGA source device into one of six potential ASIC equivalent target devices.

Package resource 11 indicates the type of package used in the FPGA and in each ASIC equivalent device. Color-coding or another visually distinguishing feature may be used to indicate which of the ASIC equivalent devices are pin-migratable with the FPGA. For example, packages that are not pin-migratable with the FPGA package may be displayed in red, while packages that are pin-migratable with the FPGA package may be displayed in green if migration is enabled and yellow if migration is not enabled. As illustrated in device selector guide 10, each of the six potential ASIC equivalent target devices are indicated to be pin-migratable with the FPGA.

Logic resource 12 indicates the total device logic usage and availability. As shown in device selector guide 10, the logic usage for the ASIC equivalent devices may be displayed as the percent of the total logic used. The logic usage of the FPGA is also displayed in two subcategories, FPGA logic cell (Lcells) 12A and DSP blocks (DSP) 12B. The FPGA may use different LEs than some or all of the ASIC equivalent devices. For example, as previously described, the LEs of the FPGA may be mapped into smaller HLEs in the ASIC equivalent circuit. Thus, estimating the actual logic usage may be difficult and unnecessary. Instead of estimating the actual number of LEs or HLEs used in each ASIC equivalent device, a more general estimate, such as a percentage, may be used to indicate the relative logic usage. For example, one algorithm that may be used to estimate the total logic usage, estimates the approximate or average number of HLEs used in the ASIC equivalent device to replace each FPGA LE. That number may be used to estimate the logic usage of the entire design and may be increased by a certain percentage to account for buffer usage and other overhead. In device selector guide 10, each of the six potential ASIC equivalent devices have sufficient total logic availability, the smallest ASIC device having an estimated usage of 19 percent.

In the present embodiment, the DSP blocks of the FPGA device are mapped into the logic of the ASIC equivalent device because none of the ASIC equivalent devices shown in device selector guide 10 have dedicated DSP hardware. The logic resources of the ASIC devices used to implement the DSP hardware may be included in the estimate of the total logic usage. If the DSP blocks are not migratable into the logic of the ASIC equivalent device, device selector guide may indicate a problem with the conversion. For example, the appropriate logic usage cell of device selector guide may be colored red or may be otherwise visually distinguished.

Further, a note, similar to note 21, may explain or contain details about the problem. Such a note may be continuously displayed in device selector guide 10 or may only be displayed while the device, resource, or cell is highlighted or selected. Notes containing further information on any element of device selector guide 10 may be shown in a similar manner.

Pins resource 13 indicates the availability of pins. Pins are one example of a resource that generally have the same usage in the FGPA design as in the ASIC equivalent device (i.e., the design will generally require the same number of pins in the ASIC device as in the FPGA). Although the quantity will remain the same, pin migration may involve complex placement rules. Thus, while an ASIC equivalent device may have enough pins available, package differences may cause pin migration problems. As illustrated in device selector guide 10, ASIC equivalent device 'ASIC1' does not have enough total pins, 'ASIC2' and 'ASIC3' have sufficient total pins, but do not have many extra pins, and the remaining ASIC equivalent target devices have more than enough total pins. As illustrated, pin resource quantities may be subcategorized into "Total", "LVDS", PCI/PCI-X", and "DDR" or any other pin type.

Memory resource 14 indicates memory resource usage. In the present embodiment, memory usage is divided into two subcategories of memory, M-RAM and M4K/M512. If the same types of memory are available in both the FPGA and the ASIC equivalent devices, then the memory may be migrated directly from the FPGA device to the ASIC equivalent devices. However, if the FPGA device uses different types of memory resources than the ASIC equivalent devices, or uses greater quantities of a particular memory resource than are contained in any of the ASIC devices, some of the memory resources of the FPGA device may be mapped or converted into different memory resource types in the ASIC equivalent devices or may be implemented within the logic of the ASIC equivalent devices.

Phase locked loop (PLL) resource 15, delay locked loop (DLL) resource 16, and serializer/de-serializer (SERDES) resource 17 indicate the resource availability and usage of these resources. Generally these resources are migrated from the FGPA design into the same or equivalent resources in the ASIC equivalent devices. However, as described above with respect to other circuit resource types, the unavailability of certain types or quantities of these or other circuit resources may be remedied by mapping or converting one resource type into another resource type or by implementing the resource in the logic of the ASIC equivalent device. Note 21, for example, indicates that although the target ASIC equivalent devices may not have sufficient quantities of Fast PLL resources, other PLL resources may be used to achieve a successful migration.

FIG. 2 is a flow chart of an illustrative method in accordance with the present invention. At step 24 the circuit resource usage of a circuit design in a source device (e.g., an FPGA) is determined and at step 25 the circuit resource availability of a target device (e.g., an ASIC equivalent device) is determined. Then, at step 26, the resource usage of the circuit design migrated into the target device is estimated. The estimate of circuit resource usage may be calculated for a number of resource categories and subcategories. Device selector guide 10 illustrates some resource categories and subcategories which may be estimated, however this list is by no means exhaustive. The estimate may be configurable to use different estimation methods or techniques and may be configured to provide different types of estimates. For example, an estimate may be a "minimum" estimate, a "maximum" estimate, or a "typical" estimate. The "minimum" estimate may determine the minimum estimated resource usage, a "maximum" estimate may determine the maximum estimated resource usage, and the "typical" estimate may determine the typical estimated resource usage. Multiple estimates of resource usage may be provided to a user or the information from multiple estimates may be combined to provide a final estimate.

At step 27, the estimated circuit resource usage in the target device is displayed. The source device resource usage and the target device resource availability may also be displayed. All of this information may be displayed as a graphical user aid, such as device selector guide 10 illustrated in FIG. 1 or in any other format that may assist the user in the device migration process.

Further, as described previously, additional information may also be displayed. Such information may include, but is not limited to, information that may indicate the possibility of successful device migration, information about the estimating techniques or assumptions used in performing the estimate, information about how to improve the probability of successful device migration, and information about why a particular device migration path is not possible.

Figure 3:
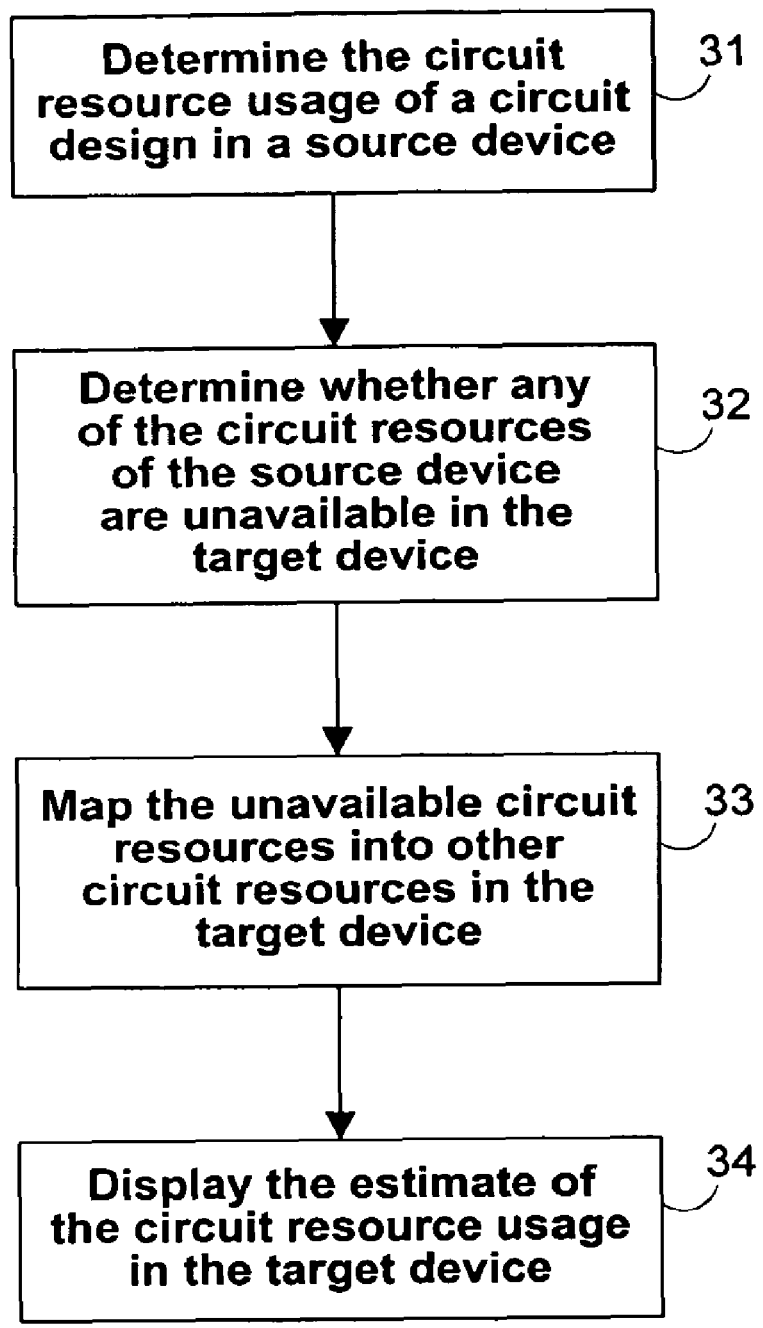
FIG. 3 is another flow chart for an illustrative method in accordance with the invention.

FIG. 3 is another flow chart of an illustrative method in accordance with the present invention. At step 31, the circuit resource usage of a circuit design in a source device is determined. At step 32, it is determined whether any of the circuit resources used in the source device are unavailable in the target device. Any circuit resources in the source device that are not available in the target device circuit resources are mapped into other circuit resources in the target device at step 33. At step 34, the estimated circuit resource usage in the target device are displayed. For example, as shown in device selector guide 10 (FIG. 1), the DSP blocks of the FPGA source device are mapped into the total logic of the ASIC equivalent target device and are included in the estimate of the total logic resources usage.

Figure 4:
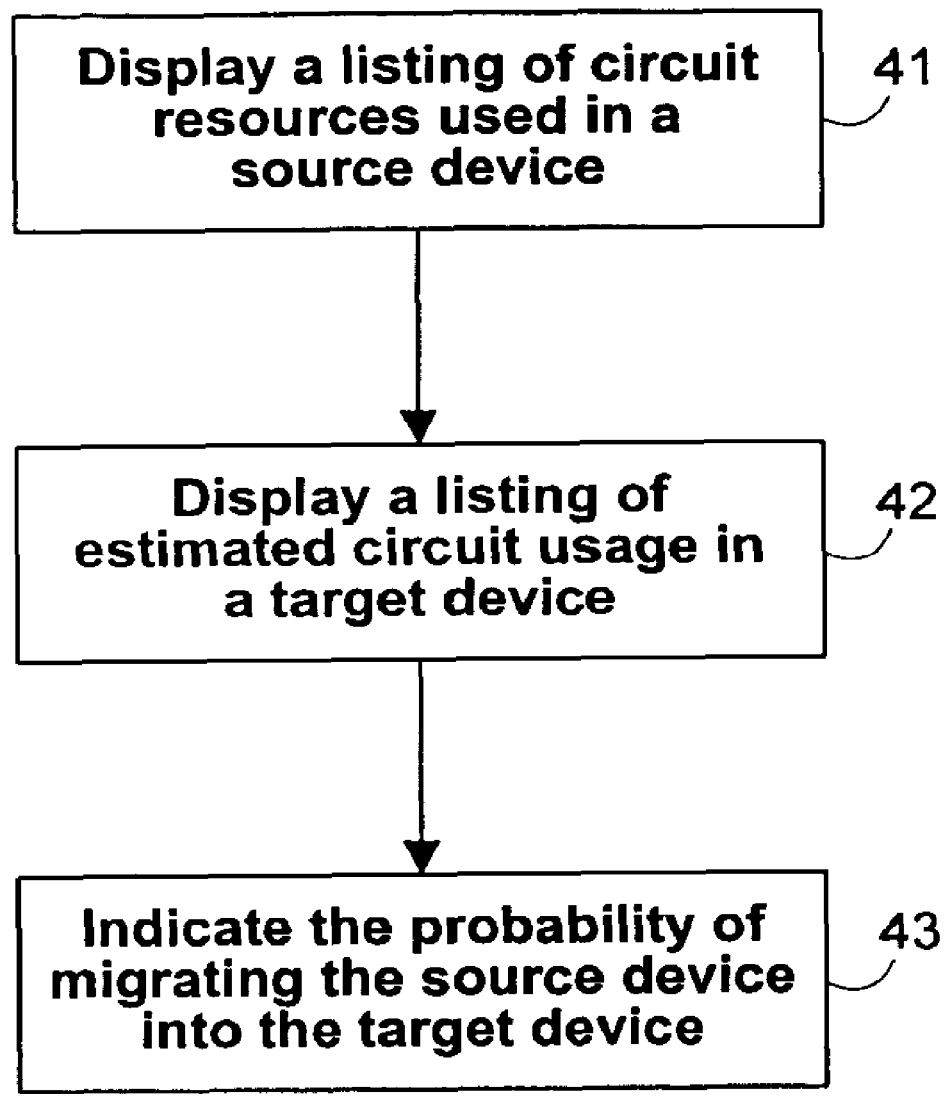
FIG. 4 is yet another flow chart for an illustrative method in accordance with the invention.

FIG. 4 is yet another flow chart of an illustrative method in accordance with the present invention. At step 41, a listing of the circuit resources used in a source device is determined. At step 42, a listing of estimated circuit resource usage is determined for the circuit design of the source device migrated into the target device. Finally, at step 43 the probability of a successful migration from the source device into the target device is determined. The probability may be determined for the entire device as a whole or individually for each individual or group of circuit resources. The probability of a successful migration may be indicated, for example, by visually distinguishing or color coding cells or columns in device selector guide 10, as previously described.

Figure 5:
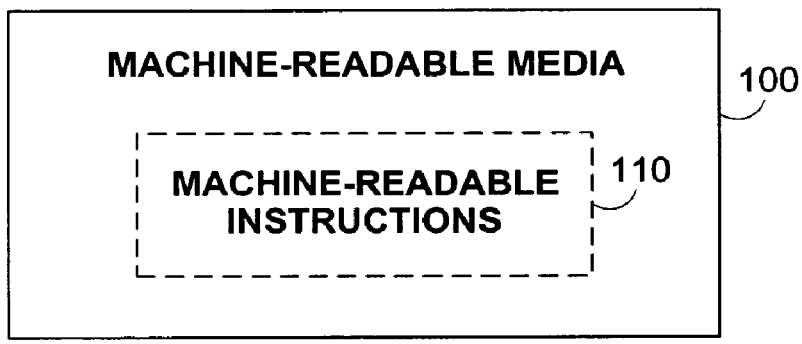
FIG. 5 is a simplified block diagram of machine-readable media in accordance with the invention.

Another possible aspect of the invention is shown in FIG. 5. This is machine-readable media 100 encoded with machine-readable instructions 110 for controlling a computer to carry out or perform any of the methods shown and described herein. Examples of suitable machine-readable media include magnetic discs, optical discs, magnetic tape, and the like.

Thus it is seen that a graphical user aid for technology migration and associated methods are provided. One skilled in the art will appreciate that the invention can be practiced by other than the described embodiments, which are presented for purposes of illustration and not of limitation, and the present invention is limited only by the claims which follow.

What is claimed is:

1. A method for displaying a graphical user aid for migrating a circuit design from a source device into a plurality of different target device types, said method comprising:
  determining circuit resources used by the circuit design in the source device;
  determining, using a computer, that at least one circuit resource used by the circuit design in the source device is unavailable in at least one target device type of the plurality of different target device types;
  mapping the at least one unavailable circuit resource into a different circuit resource in the at least one target device type; and
  displaying, on a computer display, the graphical user aid comprising circuit resource usage of the circuit design migrated into the plurality of different target device types, wherein the plurality of different target device types comprises application specific integrated circuits.

2. The method of claim 1 wherein the source device comprises a programmable logic device.

3. The method of claim 2 wherein the plurality of different target device types comprises application specific integrated circuits equivalent to programmable logic devices.

4. The method of claim 1 further comprising estimating the circuit resource usage of the circuit design migrated into each target device type of the plurality of different target device types.

5. The method of claim 1 wherein displaying the graphical user aid further comprises displaying information about the mapping of the at least one circuit resource.

6. The method of claim 1 further comprising estimating a probability of successfully migrating the circuit design from the source device into each target device type of the plurality of different target device types.

7. The method of claim 6 further comprising displaying the estimated probability of successfully migrating the circuit design from the source device into each target device type of the plurality of different target device types.

8. The method of claim 7 wherein displaying the estimated probability of successfully migrating the circuit design from the source device into each target device type of the plurality of different target device types comprises displaying the estimated probability as a high, medium, or low probability.

9. The method of claim 1 wherein each target device type of the plurality of different target device types has different amounts of available resources.

10. Non-transitory computer-readable media for displaying a graphical user aid for migrating a circuit design from a source device into a plurality of different target device types, wherein the media is encoded with machine-readable instructions for:
  determining circuit resources used by the circuit design in the source device;
  determining, using a computer, that at least one circuit resource used by the circuit design in the source device is unavailable in at least one of the plurality of different target device types;
  mapping the at least one unavailable circuit resource into a different circuit resource in at least one target device type of the plurality of different target device types; and
  displaying the graphical user aid containing an estimated circuit resource usage in the plurality of different target device types, wherein the plurality of different target device types comprises application specific integrated circuits.

11. The non-transitory computer-readable media of claim 10 wherein the source device comprises a programmable logic device.

12. The non-transitory computer-readable media of claim 11 wherein the plurality of different target device types comprises application specific integrated circuits equivalent to programmable logic devices.

13. The non-transitory computer-readable media of claim 10, wherein the media is encoded with machine-readable instructions for estimating the circuit resource usage of the circuit design migrated into each target device type of the plurality of different target device types.

14. The non-transitory computer-readable media of claim 10, wherein the media is encoded with machine-readable instructions for displaying information about the mapping of the at least one circuit resource.

15. The non-transitory computer-readable media of claim 10, wherein the media is encoded with machine-readable instructions for estimating a probability of successfully migrating the circuit design from the source device into each target device type of the plurality of different target device types.

16. A system for displaying a graphical user aid for migrating a circuit design from a source device into a plurality of different target device types comprising:
  a processor configured to:
    determine circuit resources used by the circuit design in the source device,
    determine that at least one circuit resource used by the circuit design in the source device is unavailable in at least one target device type of the plurality of different target device types, and
    map the at least one unavailable circuit resource into a different circuit resource in the at least one target device type; and
  a display configured to display the graphical user aid, wherein the graphical user aid comprises circuit resource usage of the circuit design migrated into the plurality of different target device types, wherein the plurality of different target device types comprises application specific integrated circuits.

17. The system of claim 16 wherein the source device comprises a programmable logic device.

18. The system of claim 17 wherein the plurality of different target device types comprises application specific integrated circuits equivalent to programmable logic devices.

19. The system of claim 16 wherein the processor is further configured to estimate the circuit resource usage of the circuit design migrated into each target device type of the plurality of different target device types.

20. The system of claim 16 wherein the display is further configured to display information about the mapping of the at least one resource.

* * * * *